United States Patent
Byeon

(10) Patent No.: US 9,590,627 B2
(45) Date of Patent: Mar. 7, 2017

(54) OPERATION MODE SETTING CIRCUIT OF SEMICONDUCTOR APPARATUS AND DATA PROCESSING SYSTEM USING THE SAME

(71) Applicant: SK hynix Inc., Icheon-si Gyeonggi-do (KR)

(72) Inventor: Sang Jin Byeon, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 14/220,580

(22) Filed: Mar. 20, 2014

(65) Prior Publication Data
US 2015/0162911 A1    Jun. 11, 2015

(30) Foreign Application Priority Data
Dec. 10, 2013  (KR) .................. 10-2013-0153067

(51) Int. Cl.
H03K 19/003  (2006.01)
H03K 19/0175 (2006.01)

(52) U.S. Cl.
CPC ......... *H03K 19/00369* (2013.01); *H03K 19/017581* (2013.01)

(58) Field of Classification Search
None
See application file for complete search history.

(56) References Cited

U.S. PATENT DOCUMENTS

| | | | |
|---|---|---|---|
| 6,087,851 A * | 7/2000 | Kim ............... | H03K 19/017581 326/37 |
| 6,542,140 B1 * | 4/2003 | Ishigami ............... | G09G 5/393 345/501 |
| 6,703,866 B1 * | 3/2004 | Arimilli ........ | H03K 19/017581 326/30 |
| 8,122,204 B2 * | 2/2012 | Nagao ................ | G06F 11/1666 365/189.04 |
| 2005/0078548 A1 * | 4/2005 | Kang .................... | G11C 29/46 365/232 |
| 2012/0106272 A1 * | 5/2012 | Kim ......................... | G11C 7/02 365/191 |
| 2013/0015879 A1 * | 1/2013 | Araki .............. | H03K 19/00369 326/30 |
| 2013/0028038 A1 * | 1/2013 | Fujisawa ...................... 365/222 |
| 2013/0191136 A1 * | 7/2013 | Apshago ................ | G06Q 10/10 705/2 |

FOREIGN PATENT DOCUMENTS

KR    1020060003434 A    1/2006

* cited by examiner

*Primary Examiner* — Crystal L Hammond
(74) *Attorney, Agent, or Firm* — William Park & Associates Ltd.

(57) ABSTRACT

An operation mode setting circuit of a semiconductor apparatus includes a mode register set configured to update an operation mode information generated internally at the semiconductor apparatus based on preliminary information data in response to a preliminary information setting signal and a preliminary information providing block configured to provide the preliminary information data selected from a plurality of pre-stored preliminary information data to the mode register setting response to the preliminary information setting signal, the selected preliminary information data corresponding to a detected operation parameter detected in response to the preliminary information setting signal.

28 Claims, 7 Drawing Sheets

OPERATION MODE SETTING CIRCUIT OF SEMICONDUCTOR APPARATUS AND DATA PROCESSING SYSTEM USING THE SAME

CROSS-REFERENCES TO RELATED APPLICATION

The present application claims priority under 35 U.S.C. §119(a) to Korean application number 10-2013-0153067, filed on Dec. 9, 2013, in the Korean Intellectual Property Office, which is incorporated herein by reference in its entirety.

TECHNICAL FIELD

Various embodiments generally relate to a semiconductor apparatus, and more particularly, to an operation mode setting circuit of a semiconductor apparatus and a data processing system using the same.

BACKGROUND

A semiconductor apparatus often operates in a number of different operating environments. Different operation modes may be associated with one or more of the different operating environments. In many cases, the semiconductor apparatus uses an operation mode setting circuit to set the operation mode of the semiconductor apparatus.

An operating environment may be defined by a number of different operation parameters. Examples of such operation parameters include, but are not limited to, a cycle time of an external clock cycle supplied to the semiconductor apparatus, an external temperature of the semiconductor apparatus, an internal temperature of the semiconductor apparatus and a power supply voltage supplied to the semiconductor apparatus.

In many cases, one or more of the operating parameters that define the operating environment of the semiconductor apparatus varies.

SUMMARY

An embodiment of an operation mode setting circuit of a semiconductor apparatus may include: a mode register set configured to update an operation mode information generated internally at the semiconductor apparatus based on preliminary information data in response to a preliminary information setting signal; and a preliminary information providing block configured to provide the preliminary information data selected from g a plurality of pre-stored preliminary information data to the mode register setting response to the preliminary information setting signal, the selected preliminary information corresponding to a detected variation in an operation parameter detected in response to the preliminary information setting signal.

In an embodiment, a data processing system may include: a controller configured to provide a preliminary information setting signal; and a semiconductor apparatus configured to update an operation mode information of a mode register set based on preliminary information data selected from a plurality of pre-stored preliminary information data in response to the preliminary information setting signal, the selected preliminary information data corresponding to a detected variation in an operation parameter.

In an embodiment, an operating mode setting circuit of a semiconductor apparatus may include: a mode register configured to update an operation mode information generated at the semiconductor apparatus based on preliminary information data in response to a preliminary information setting signal; and a preliminary information providing block configured to provide the preliminary information data selected from a plurality of pre-stored preliminary information data to a mode register in response to the preliminary information setting signal, the selected preliminary information data corresponding to a detected value of an operation parameter.

BRIEF DESCRIPTION OF THE DRAWINGS

Features, aspects, and embodiments are described in conjunction with the attached drawings, in which.

DETAILED DESCRIPTION

Hereinafter, various embodiments of an operation mode setting circuit of a semiconductor apparatus and a data processing system using the same will be described below with reference to the accompanying drawings.

Figure 1:
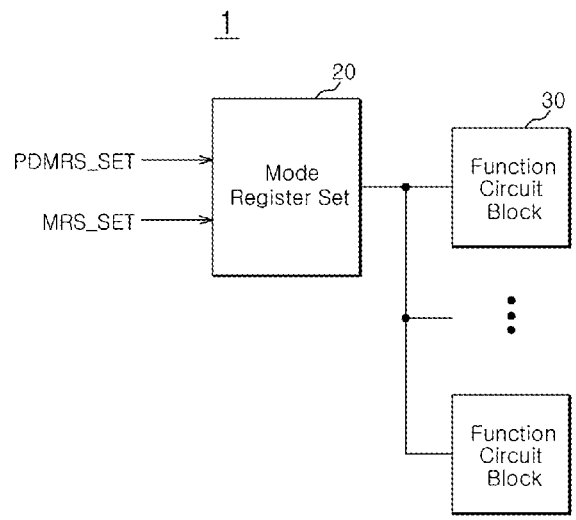
FIG. 1 is a block diagram showing an embodiment of a operation mode setting circuit of a semiconductor apparatus.

As shown in FIG. 1, an embodiment of an operation mode setting circuit 1 of a semiconductor apparatus includes a mode register set (MRS) 20. The semiconductor apparatus may be configured to store operation mode information associated with two of more of the different operation modes in a mode register set (MRS) 20.

The semiconductor apparatus includes a number of function circuit blocks 30. The mode register set 20 may be configured to provide an initial set of operation mode information to the function circuit blocks 30.

The mode register set 20 may be configured to reset the operation mode information in response to an operation mode setting command MRS_SET received at the semiconductor apparatus from a device external to the semiconductor apparatus. One example of such an external device is a controller that controls the operation of the semiconductor apparatus.

The mode register set 20 may be configured to update the operation mode information in response to a preliminary information setting signal PDMRS_SET. The preliminary information mode setting signal PDMRS_SET may be received at the semiconductor apparatus from a device external to the semiconductor apparatus. One example of such a device is a controller that controls the operation of the semiconductor apparatus.

The preliminary information setting signal PDMRS_SET may be a signal that is generated internally by the semiconductor apparatus in response to a signal associated with the initialization of the semiconductor apparatus. An example of a signal associated with the initialization of the semiconductor apparatus is a power-up signal (PWR).

The mode register set 20 may be configured to transmit the reset operation mode information to the function circuit blocks 30. The function circuit blocks 30 perform their respective functions associated with the operation of the semiconductor apparatus, including for example, the input/output of data, in accordance with the operation mode information provided by the mode register set 20.

Figure 2:
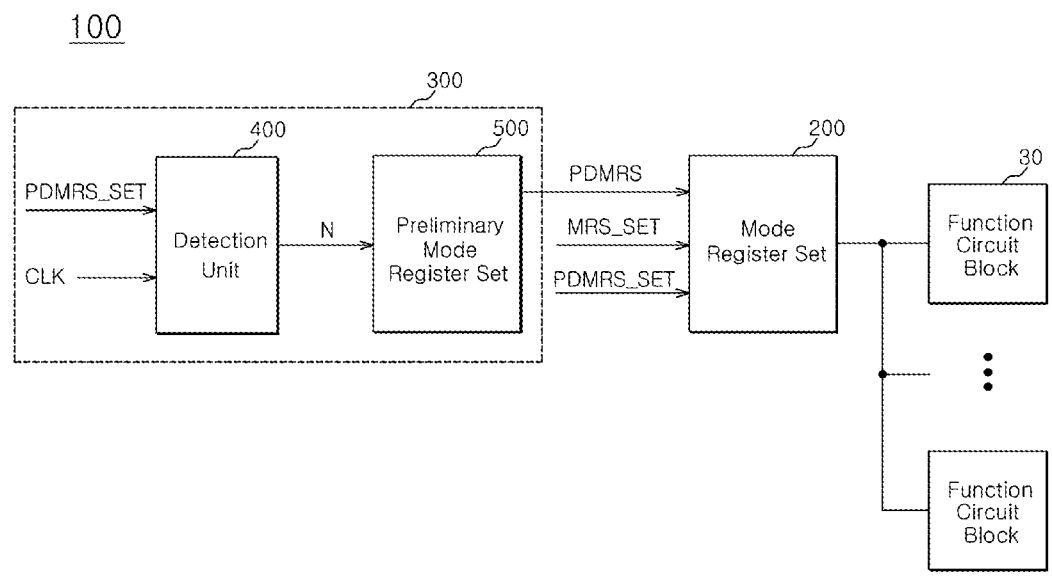
FIG. 2 is a block diagram showing an embodiment of an operation mode setting circuit of a semiconductor apparatus.

As shown in FIG. 2, an embodiment of an operation mode setting circuit 100 of a semiconductor apparatus may include a mode register set 200 and a preliminary information providing block 300.

The mode register set 200 may be configured to set an operation mode information in accordance with and in response to an operation mode setting command MRS_SET received at the semiconductor apparatus.

The mode register set 200 may be configured to update the operation mode information based on preliminary information data PDMRS generated internally by the semiconductor apparatus in response to a preliminary information setting signal PDMRS_SET.

The operation mode setting command MRS_SET may be a command for resetting the operation mode information at the mode register set 200. The operation mode setting command MRS_SET may be received from a device external to the semiconductor apparatus. One example of such an external device is a controller which controls the operation of the semiconductor apparatus.

The preliminary information setting signal PDMRS_SET may be a signal which is generated internally by the semiconductor apparatus in response to a signal associated with the initialization of the semiconductor apparatus. An example of a signal associated with the initialization of the semiconductor apparatus is a power-up signal (PWR).

The preliminary information setting signal PDMRS_SET may be provided to the semiconductor apparatus from the controller.

In the case where the controller provides the preliminary information setting signal PDMRS_SET to the semiconductor apparatus, the controller may provide the preliminary information setting signal PDMRS_SET in the form of a command to the semiconductor apparatus. The semiconductor apparatus may internally generate the preliminary information data PDMRS for setting the operation mode information and may perform an operation mode information update operation based on the internally generated preliminary information data PDMRS in response to the received preliminary information setting signal PDMRS_SET.

The mode register set 200 provides the operation mode information to function circuit blocks 30.

The function circuit blocks 30 perform their respective functions associated with the operation of the semiconductor apparatus, such as for example the input/output of data, in accordance with the operation mode information provided by the mode register set 200.

In an embodiment, the preliminary information providing block 300 may be configured to provide to the mode register set 200 the preliminary information data PDMRS corresponding to a detected variation or change in one or more operation parameters. In an embodiment, the preliminary information providing block 300 may be configured to provide to the mode register set 200, the preliminary information data corresponding to a detected value of one or more of the operation parameters. One example of a variation in an operation parameter is a change in the cycle time (tCK) of an external clock signal CLK. The cycle time tCK of the external clock signal CLK is detected in response to the preliminary information setting signal PDMRS_SET.

The preliminary information providing block 300 may be configured to detect the cycle time (tCK) of the external clock signal CLK in response to the preliminary information setting signal PDMRS_SET and output a representation of the detected one cycle time (tCK) as an update control signal N.

The preliminary information providing block 300 may be configured to provide the preliminary information data PDMRS corresponding to the update control signal N generated in response to the preliminary information setting signal PDMRS_SET to the mode register set 200.

The preliminary information providing block 300 may include a detection unit 400 and a preliminary mode register set 500.

The detection unit 400 may be configured to generate the update control signal N in response to the preliminary information setting signal PDMRS_SET and the external clock signal CLK received at the detection unit 400. The detection unit 400 transmits the update control signal N to the preliminary mode register set 500.

The preliminary mode register set 500 may be configured to store a plurality of preliminary information data where each of the plurality of preliminary information data is associated with a different value of the update control signal N. The preliminary mode register set 500 may be configured to provide the one of the plurality of pre-stored preliminary information data PDMRS which corresponds to the received update control signal N to the mode register set 200.

Figure 3:
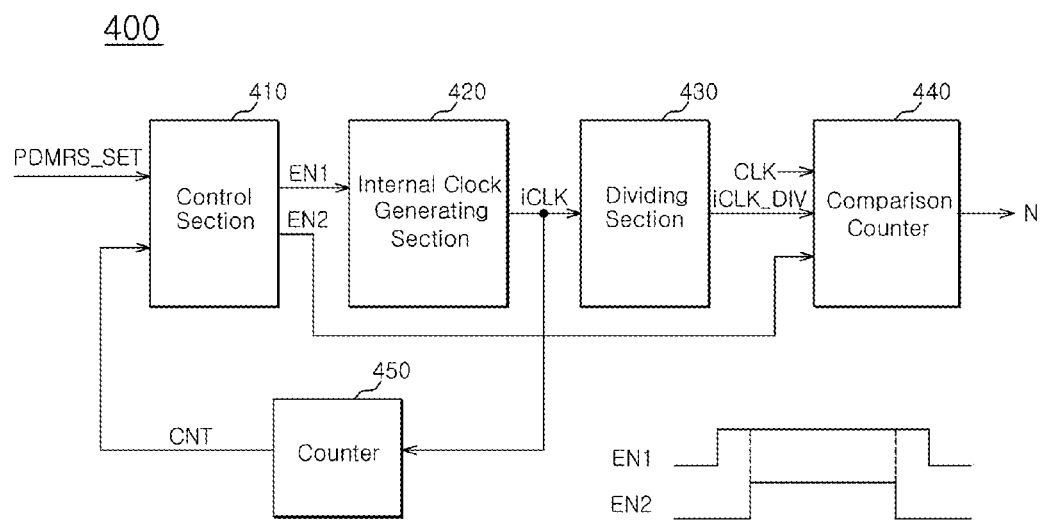
FIG. 3 is a block diagram of the detection unit shown in FIG. 2.

As shown in FIG. 3, the detection unit 400 may include a control section 410, an internal clock generating section 420, a dividing section 430, a comparison counter 440, and a counter 450.

The control section 410 may be configured to generate a first enable signal EN1 and a second enable signal EN2 in response to the preliminary information setting signal PDMRS_SET and a count signal CNT received from the counter 450.

The control section 410 may be configured to activate the first enable signal EN1 or/and the second enable signal EN2 in response to the preliminary information setting signal PDMRS_SET, and deactivate the first enable signal EN1 or/and the second enable signal EN2 in response to the count signal CNT.

The control section 410 generates the first enable signal EN1 and the second enable signal EN2 in such a manner that the activation period of the second enable signal EN2 occurs during the activation period of the first enable signal EN1.

The control section 410 may be configured to activate the first enable signal EN1 in response to the preliminary information setting signal PDMRS_SET. The control section 410 may be configured to activate the second enable signal EN2 a predetermined time period following the rising edge of the first enable signal EN1. In other words, the control section 410 may be configured to delay the activation of the second enable signal EN2 a predetermined time period following the rising edge of the activated first enable signal EN1.

The control section 410 may be configured to deactivate the second enable signal EN2 when a value of the count signal CNT reaches a predetermined value and to deactivate the first enable signal EN1 a predetermined time period following the falling edge of the second enable signal EN2. In other words, the control section 410 may be configured to delay the deactivation of the first enable signal EN1 a predetermined time period following the falling edge of the deactivated second enable signal EN2.

The internal clock generating section 420 receives the first enable signal EN1 from the control section 410. The internal clock generating section 420 may be configured to generate an internal clock signal iCLK during the activation period of the first enable signal EN1.

The internal clock generating section 420 may include an oscillator.

The dividing section 430 may be configured to receive the internal clock signal iCLK from the internal clock generating section 420. The dividing section 430 may be configured to divide the internal clock signal iCLK in accordance with a predetermined division ratio and generate a divided clock signal iCLK_DIV.

The comparison counter 440 may be configured to receive the external clock signal CLK, the internal clock signal iCLK and the second enable signal EN2 as inputs. The comparison counter 440 may be configured to compare the divided clock signal iCLK_DIV and the clock signal CLK during the activation period of the second enable signal EN2 and generate the update control signal N.

The comparison counter 440 may be configured to compare the divided clock signal iCLK_DIV with the clock signal CLK during the activation period of the second enable signal EN2. The comparison counter 440 may be configured to count the number of rising edges of the divided clock signal iCLK_DIV that occur during the activation period of the second enable signal and generate an update control signal N representative of the results of the comparison. The comparison counter 440 may be configured to count the number falling edges of the divided clock signal iCLK_DIV that occur during the activation period of the second enable signal and generate an update control signal N representative of the results of the comparison.

That is to say, the update control signal N may include information on the number of internal clock signals iCLK that occur during a single cycle (tCK) of the external clock signal CLK.

In cases where a single cycle (tCK) of the external clock signal CLK is longer than a single cycle of the internal clock signal iCLK, the activation period of the first enable signal EN1 may be lengthened. The internal clock generating section 420 may be configured to generate a lengthened internal clock signal iCLK based on the lengthened activation period of the first enable signal EN1. The dividing section may be configured to divide the lengthened internal clock signal iCLK by a predetermined division ratio to generate a lengthened divided clock signal iCLK_DIV. The comparison counter 440 may be configured to compare the lengthened divided clock signal iCLK_DIV with the external clock signal CLK to generate the update control signal N.

An embodiment of the preliminary information providing block 300 is configured to compare the divided clock signal iCLK_DIV with the external clock signal CLK as described above. In an embodiment, the preliminary information providing block 300 may be configured to compare the internal clock signal iCLK with the external clock signal CLK.

The counter 450 may be configured to count the internal clock signal iCLK and generate the count signal CNT. The count signal CNT is received from the counter 450 at the control section 410. The control section 410 may be configured to deactivate the first enable signal EN1 and/or the second enable signal EN2 in response to the count signal CNT.

Figure 4:
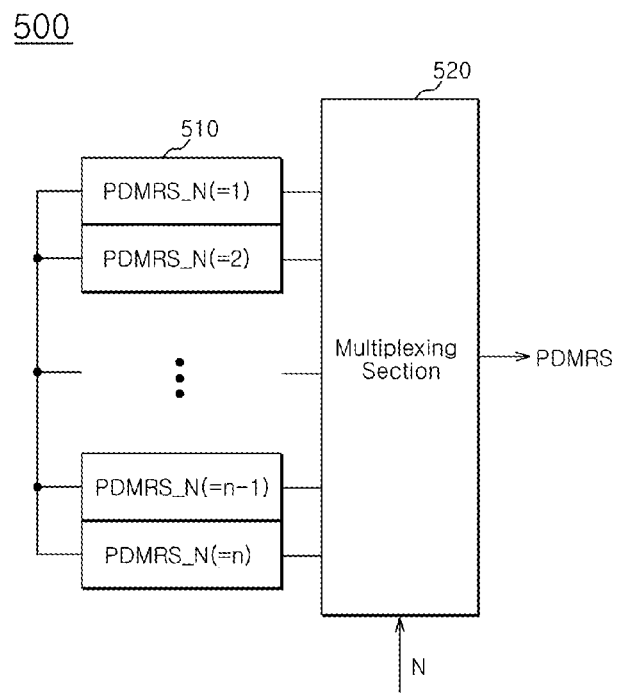
FIG. 4 is a block diagram of the preliminary mode register set shown in FIG. 2.

The preliminary mode register set 500 may be configured to receive the update control signal N as an input and generate preliminary information data PDMRS associated with the value of the received update control signal N. As shown in FIG. 4, the preliminary mode register set 500 may include a plurality of preliminary mode registers 510 and a multiplexing section 520.

The plurality of preliminary mode registers 510 may be configured to store a plurality of preliminary information data PDMRS where each preliminary information data PDMRS corresponds to a value of the update control signal N.

The multiplexing section 520 may be configured to select the preliminary information data PDMRS from the plurality of preliminary information data PDMRS stored in the plurality of preliminary mode registers 510, which corresponds to the value of the update control signal N received from the detection unit 400 at the preliminary mode register set 500. The preliminary mode register set 500 transmits the selected preliminary information data PDMRS to the mode register set 200.

The embodiment of the operation mode setting circuit 100 of a semiconductor apparatus described above automatically detects a variation or change in the cycle (tCK) of the external clock signal CLK and generates an update control signal N that is representative to the detected change or variation in response to the preliminary information setting signal PDMRS_SET. In an embodiment, the operation mode setting circuit 100 of a semiconductor apparatus automatically detects a value of the cycle time (tCK) of the external clock signal CLK and generates an update control signal N that is representative of the detected cycle time (tCK) in response to the preliminary information setting signal PDMRS_SET. In an embodiment, the preliminary information setting signal PDMRS_SET is internally generated by the semiconductor apparatus. In an embodiment, the preliminary information setting signal PDMRS_SET is received from the controller. As mentioned above, the preliminary mode register set 200 forwards the preliminary information data PDMRS selected from the plurality of preliminary data PDMRS stored at the preliminary register set 500 to the mode register set 200. The forwarded preliminary information data PDMRS corresponds to the value of the update control signal N. The operation mode setting circuit 100 updates the operation mode information at the mode register set 200 using the received the preliminary information data PDMRS.

The mode register set 200 provides the updated operation mode information to the function circuit blocks 30.

The function circuit blocks 30 perform their respective functions associated with operation of the semiconductor apparatus, including for example the input/output of data, in accordance with the operation mode information provided by the mode register set 200.

Figure 5:
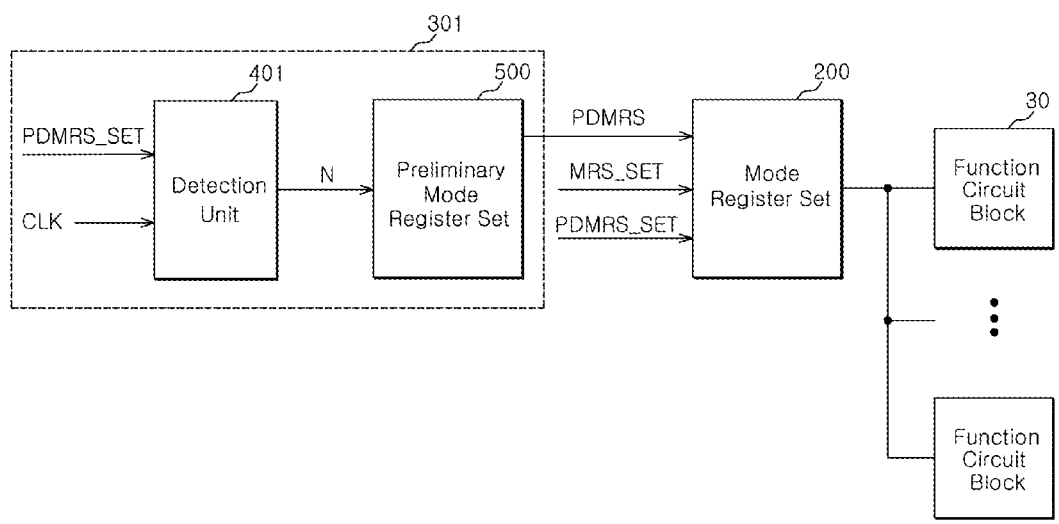
FIG. 5 is a block diagram showing an embodiment of an operation mode setting circuit of a semiconductor apparatus.

As shown in FIG. 5, an embodiment of an operation mode setting circuit 101 of a semiconductor apparatus may include a mode register set 200 and a preliminary information providing block 301.

The mode register set 200 may be configured to set an operation mode information in accordance with and in response to an operation mode setting command MRS_SET received at the semiconductor apparatus.

The mode register set 200 may be configured to update the operation mode information based on preliminary information data PDMRS generated by the semiconductor apparatus in response to a preliminary information setting signal PDMRS_SET.

The operation mode setting command MRS_SET may be a command for resetting the operation mode information at the mode register set 200. The mode setting command MRS_SET may be received from a device external to the semiconductor apparatus. One example of such an external device is a controller which controls the operation of the semiconductor apparatus.

The preliminary information setting signal PDMRS_SET may be a signal which is generated internally by the semiconductor apparatus in response to a signal associated with the initialization of the semiconductor apparatus. An example of a signal associated with the initialization of the semiconductor apparatus is a power-up signal (PWR).

The preliminary information setting signal PDMRS_SET may be provided to the semiconductor apparatus from the controller.

In the case where the controller provides the preliminary information setting signal PDMRS_SET to the semiconductor apparatus, the controller may provide the preliminary information setting signal PDMRS_SET in the form of a command to the semiconductor apparatus. The semiconductor apparatus may internally generate the preliminary information data PDMRS for setting the operation mode information and may perform an operation mode information update operation in response to the received preliminary information setting signal PDMRS_SET.

The mode register set 200 provides the operation mode information to function circuit blocks 30.

The function circuit blocks 30 perform their respective functions associated with the operation of the semiconductor apparatus, such as for example the input/output of data, in accordance with the operation mode information provided by the mode register set 200.

In an embodiment, the preliminary information providing block 301 may be configured to provide, to the mode register set 200, the preliminary information data PDMRS corresponding to a detected variation or change in one or more operation parameters. In one embodiment, the preliminary information providing block 301 may be configured to provide to the mode register set 200, preliminary information data corresponding to a detected value of one or more operation parameters. One example of an operation parameter is the cycle time (tCK) of an external clock signal CLK. The cycle time tCK of the external clock signal CLK is detected in response to the preliminary information setting signal PDMRS_SET.

The preliminary information providing block 301 may be configured to detect the cycle time (tCK) of the external clock signal CLK in response to the preliminary information setting signal PDMRS_SET and output a representation of the detected cycle time (tCK) as an update control signal N.

The preliminary information providing block 301 may be configured to provide the preliminary information data PDMRS corresponding to the update control signal N generated in response to the preliminary information setting signal PDMRS_SET to the mode register set 200.

The preliminary information providing block 301 may include a detection unit 401 and a preliminary mode register set 500.

The detection unit 401 may be configured to generate the update control signal N in response to the preliminary information setting signal PDMRS_SET and the external clock signal CLK received at the detection unit 401. The detection unit 401 transmits the update control signal N to the preliminary mode register set 500.

The preliminary mode register set 500 may be configured to store a plurality of preliminary information data PDMRS where each of the plurality of preliminary information data PDMRS is associated with a different value of the update control signal N. The preliminary mode register set 500 may be configured to provide the one of the plurality of pre-stored preliminary information data PDMRS, which corresponds to the received update control signal N to the mode register set 200.

The preliminary mode register set 500 may be configured as shown in FIG. 4.

Figure 6:
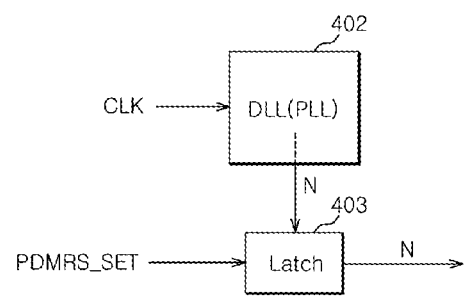
FIG. 6 is a block diagram of the detection unit shown in FIG. 5.

As shown in FIG. 6, the detection unit 401 may include a synchronization circuit 402 and a latch 403.

The synchronization circuit 402 may include a delay-locked loop (DLL) circuit or a phase-locked loop (PLL) circuit.

The semiconductor apparatus may use the delay-locked loop (DLL) circuit or the phase-locked loop (PLL) circuit, for domain crossing the external clock signal CLK received at the semiconductor apparatus and internal signal processing timing of the semiconductor apparatus.

The delay-locked loop (DLL) circuit or the phase-locked loop (PLL) circuit performs the delay locking or the phase locking of the external clock signal CLK to synchronize the external clock signal CLK with the internal timing of the semiconductor apparatus thereby generating information on the cycle time (tCK) of the external clock signal CLK.

The latch 403 in the synchronization circuit 402 may be configured to latch the information on the cycle time (tCK) of the external clock signal CLK. The latch 403 may be configured to issue the information on the cycle time tCK of the external clock cycle CLK in the form of an update control signal N in response to the preliminary information setting signal PDMRS_SET.

The configuration of the latch 403 is one example of a mechanism that may be used to generate the information on the cycle time (tCK) of the external clock signal CLK generated by the use of delay-locked loop (DLL) circuit or the phase-locked loop (PLL) circuit as the update control signal N.

The embodiment of the operation mode setting circuit 101 of a semiconductor apparatus described above may use the information on the cycle time (tCK) of the external clock signal CLK which is generated through the use of the delay-locked loop (DLL) circuit or the phase-locked loop (PLL) circuit to issue the update control signal N, in response to the preliminary information setting signal PDMRS_SET. In an embodiment, the preliminary information setting signal PDMRS_SET is internally generated by the semiconductor apparatus. In an embodiment, the preliminary information setting signal PDMRS_SET is provided by the controller. The detection unit 401 forwards the update control signal N to the preliminary mode register 200.

The preliminary mode register set 500 may be configured to provide the one of the plurality of pre-stored preliminary information data PDMRS, which corresponds to the received update control signal N to the mode register set 200.

The operation mode setting circuit 101 updates the operation mode information at the mode register set 200 using the received preliminary information data PDMRS.

The mode register set 200 provides the updated operation mode information to the function circuit blocks 30.

The function circuit blocks 30 perform their respective functions associated with the operation of the semiconductor apparatus, including for example the input/output of data, in accordance with the operation mode information provided by the mode register set 200.

Figure 7:
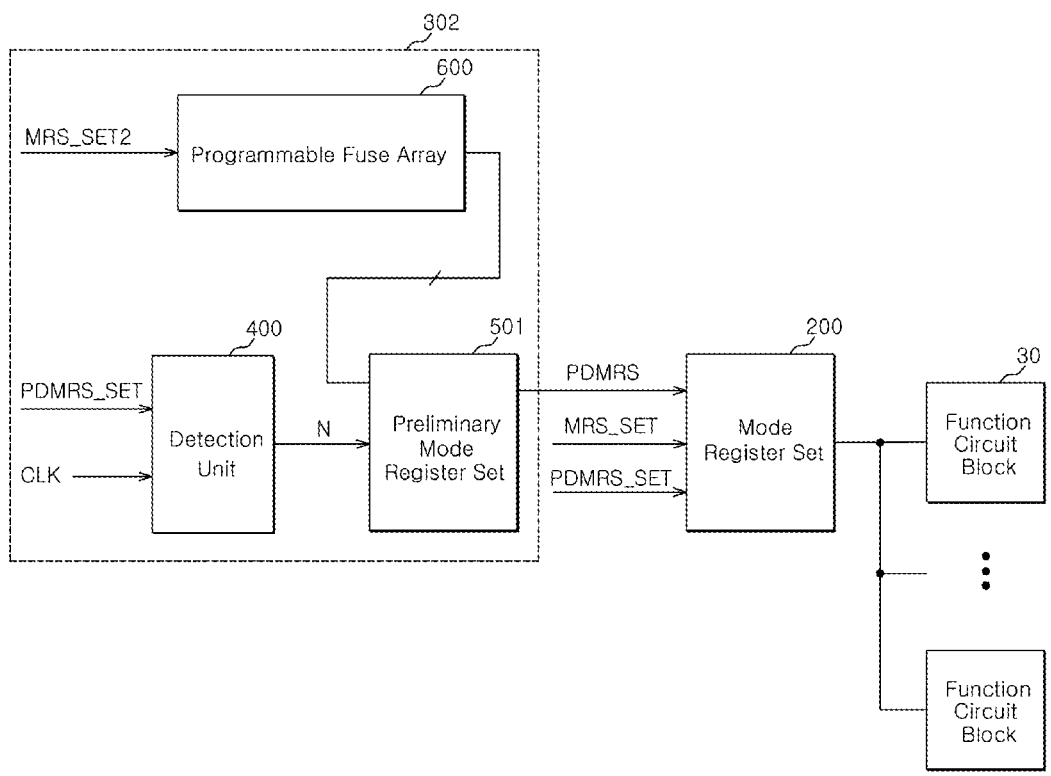
FIG. 7 is a block diagram showing an embodiment of an operation mode setting circuit of a semiconductor apparatus.

As shown in FIG. 7, an embodiment of an operation mode setting circuit 102 of a semiconductor apparatus may include a mode register set 200 and a preliminary information providing block 302.

The mode register set 200 may be configured to set an operation mode information in accordance with and in response to an operation mode setting command MRS_SET received at the semiconductor apparatus.

The mode register set 200 may be configured to update the operation mode information based on preliminary information data PDMRS generated internally by the semiconductor apparatus in response to a preliminary information setting signal PDMRS_SET.

The operation mode setting command MRS_SET may be a command for resetting the operation mode information at the mode register set 200 that is received from a device external to the semiconductor apparatus. One example of such an external device is a controller which controls the operation of the semiconductor apparatus.

The preliminary information setting signal PDMRS_SET may be a signal which is generated internally by the semiconductor apparatus in response to a signal associated with the initialization of the semiconductor apparatus. An example of a signal associated with the initialization of the semiconductor apparatus is a power-up signal (PWR).

The preliminary information setting signal PDMRS_SET may be provided to the semiconductor apparatus from the controller.

In the case where the controller provides the preliminary information setting signal PDMRS_SET to the semiconductor apparatus, the controller may provide the preliminary information setting signal PDMRS_SET in the form of a command to the semiconductor apparatus. The semiconductor apparatus may internally generate the preliminary information data PDMRS for setting the operation mode information and may perform an operation mode information update operation based on the internally generated preliminary information data PDMRS in response to the received preliminary information setting signal PDMRS_SET.

The mode register set 200 provides the operation mode information to function circuit blocks 30.

The function circuit blocks 30 perform their respective functions associated with the operation of the semiconductor apparatus, such as for example the input/output of data, in accordance with the operation mode information provided by the mode register set 200.

In an embodiment, the preliminary information providing block 302 may be configured to provide to the mode register set 200 the preliminary information data PDMRS corresponding to a detected variation or change in one or more operation parameters. In one embodiment, the preliminary information providing block 302 may be configured to provide to the mode register set 200 preliminary information data PDMRS corresponding to a detected value of one or more operation parameters. One example of an operation parameter is the cycle time (tCK) of an external clock signal CLK. The cycle time tCK of the external clock signal CLK is detected in response to the preliminary information setting signal PDMRS_SET.

The preliminary information providing block 302 may be configured to store a plurality of preliminary information data PDMRS. The preliminary information providing block 302 may be configured to control the values of the plurality of pre-stored preliminary information data PDMRS in response to a preliminary information control command MRS_SET2.

The preliminary information control command MRS_SET2 may be provided to the semiconductor apparatus from a device external to the semiconductor apparatus. One example of such a device is a controller. The preliminary information control command MRS_SET2 may include a test mode command.

The preliminary information providing block 302 may be configured to detect the cycle time (tCK) of the external clock signal CLK and output a representation of the detected cycle time (tCK) as an update control signal N.

The preliminary information providing block 302 may be configured to provide the preliminary information data PDMRS corresponding to the update control signal N associated with the detected cycle time (tCK) of the external clock signal CLK to the mode register set 200 in response to the preliminary information setting signal PDMRS_SET.

The preliminary information providing block 302 may include a detection unit 400, a preliminary mode register set 501, and a programmable fuse array 600.

The detection unit 400 may be configured to generate the update control signal N in response to the preliminary information setting signal PDMRS_SET and the external clock signal CLK. In an embodiment, the detection unit 400 may be configured as shown in FIG. 3. In an embodiment, the detection unit 400 may be configured as shown in FIG. 6. The detection unit 400 forwards the update control signal N to the preliminary mode register set 501.

The preliminary mode register set 501 may be configured to store a plurality of preliminary information data PDMRS where each of the plurality of preliminary information data PDMRS is associated with a different value of the update control signal N. The preliminary mode register set 501 may be configured to provide the one of the plurality of pre-stored preliminary information data PDMRS which corresponds to the update control signal N to the mode register set 200.

The programmable fuse array 600 may be configured to control the values of the plurality of the pre-stored preliminary information data PDMRS in the preliminary mode register set 501 in response to the preliminary information control command MRS_SET2.

While not shown, the programmable fuse array 600 may include a fuse array and a fuse control unit for controlling the electrical coupling state of the fuse array in accordance with the preliminary information control command MRS_SET2.

Figure 8:
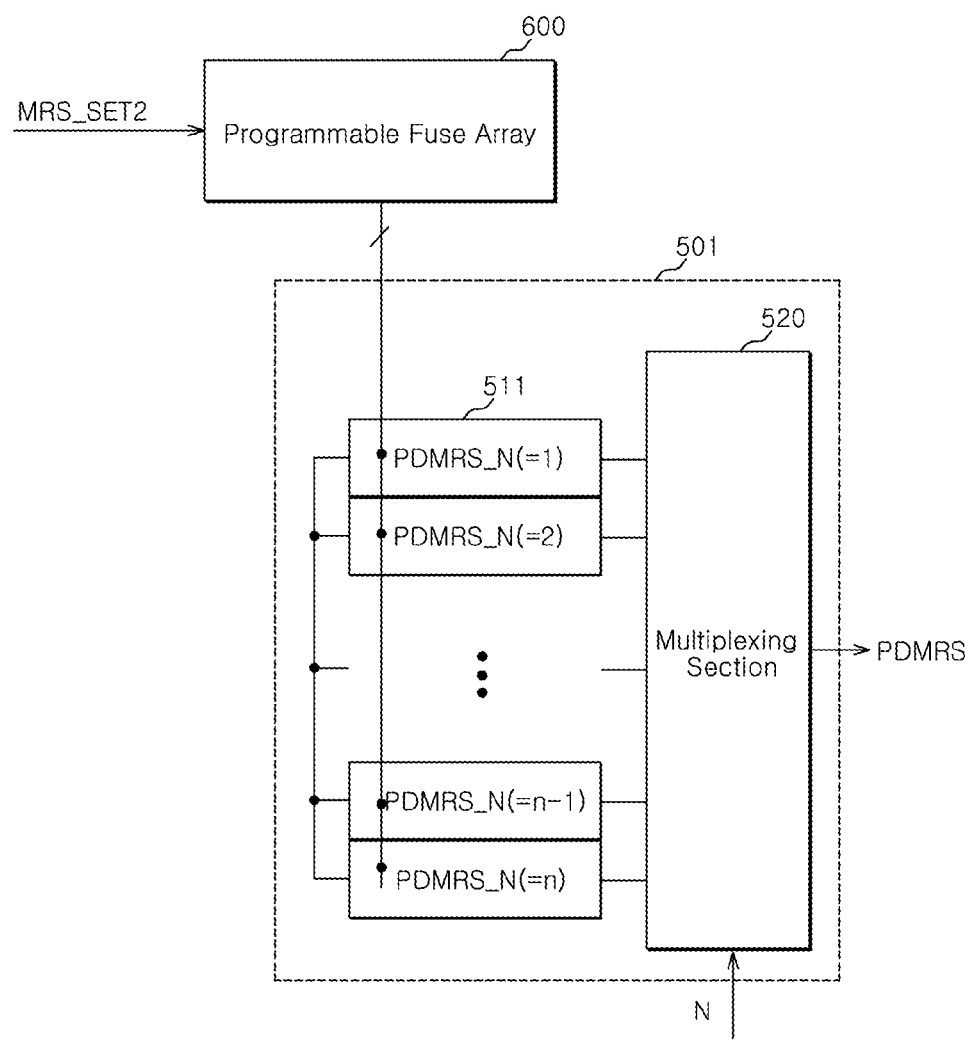
FIG. 8 is a block diagram showing the electrical coupling relationship between the programmable fuse array and the preliminary mode register set shown in FIG. 7.

As shown in FIG. 8, the preliminary mode register set 501 may include a plurality of preliminary mode registers 511 and a multiplexing section 520.

The plurality of preliminary mode registers 511 may be configured to store a plurality of preliminary information data PDMRS where each preliminary information data PDMRS corresponds to a value of the update control signal N.

The plurality of preliminary mode registers 511 may be configured such that the respective values of the plurality of pre-stored preliminary information data PDMRS may be controlled by the programmable fuse array 600.

The multiplexing section 520 may be configured to select the preliminary information data PDMRS from the plurality of preliminary information data PDMRS stored in the plurality of preliminary mode registers 511, which corresponds to the value of the update control signal N received from the detection unit 400 at the preliminary mode register set 501. The preliminary mode register set 501 transmits the selected preliminary information data PDMRS to the mode register set 200.

An embodiment of the operation mode setting circuit 102 of a semiconductor apparatus automatically detects a variation or change in the cycle time (tCK) of the external clock signal CLK and generates an update control signal N that is representative of the detected change or variation in the cycle time (tCK) of the external clock cycle CLK in response to the preliminary information setting signal PDMRS_SET. An embodiment of the operation mode setting circuit 102 of the semiconductor apparatus automatically detects a value of the cycle time (tCK) of the external clock CLK in response to the preliminary information setting signal PDMRS_SET. In an embodiment, the preliminary information setting signal PDMRS_SET is internally generated by the semiconductor apparatus. In an embodiment, the preliminary information setting signal PDMRS_SET is received from the controller. The detection unit 401 forwards the update control signal N to the preliminary mode register 200.

The operation mode setting circuit 102 controls the respective values of the plurality of preliminary information data PDMRS which are pre-stored in the preliminary mode register set 501 when the preliminary information control command MRS_SET2 is processed by the operation mode setting circuit 102.

The operation mode setting circuit 102 updates the operation mode information at the mode register set 200 using the preliminary information data PDMRS generated by the preliminary mode register set 501 and corresponding to the update control signal N generated by the detection unit 400.

The mode register set 200 provides the updated operation mode information to the function circuit blocks 30.

The function circuit blocks 30 perform their respective functions associated with operations of the semiconductor apparatus, including for example the input/output of data, in accordance with the operation mode information provided by the mode register set 200.

Figure 9:
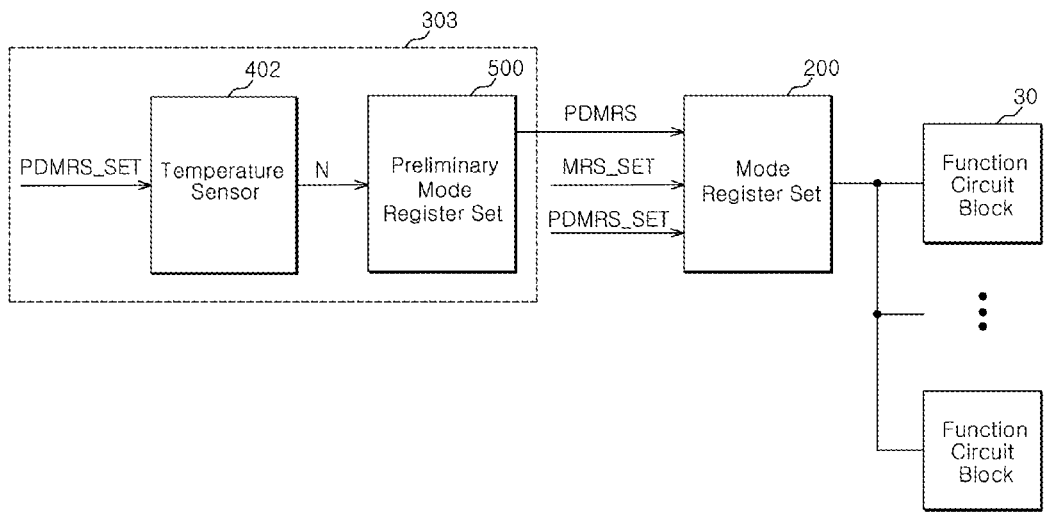
FIG. 9 is a block diagram showing an embodiment of an operation mode setting circuit of a semiconductor apparatus.

As shown in FIG. 9, an embodiment of an operation mode setting circuit 103 of a semiconductor apparatus may include a mode register set 200 and a preliminary information providing block 303.

The mode register set 200 may be configured to set an operation mode information in accordance with external and in response to an operation mode setting command MRS_SET received at the semiconductor apparatus.

The mode register set 200 may be configured to update the operation mode information based on preliminary information data PDMRS generated internally by the semiconductor apparatus in response to a preliminary information setting signal PDMRS_SET.

The operation mode setting command MRS_SET may be a command for resetting the operation mode information at the mode register set 200. The operation mode setting command MRS_SET may be received from a device external to the semiconductor apparatus. One example of such a device is a controller which controls the operation of the semiconductor apparatus.

The preliminary information setting signal PDMRS_SET may be a signal which is generated internally by the semiconductor apparatus in response to a signal associated with the initialization of the semiconductor apparatus. An example of a signal associated with the initialization of the semiconductor apparatus is a power-up signal (PWR).

The preliminary information setting signal PDMRS_SET may be provided to the semiconductor apparatus from the controller.

In the case where the controller provides the preliminary information setting signal PDMRS_SET to the semiconductor apparatus, the controller may provide the preliminary information setting signal PDMRS_SET in the form of a command to the semiconductor apparatus. The semiconductor apparatus may internally generate the preliminary information data PDMRS for setting the operation mode information and may perform an operation mode information update operation in response to the received preliminary information setting signal PDMRS_SET.

The mode register set 200 provides the operation mode information to function circuit blocks 30.

The function circuit blocks 30 perform their respective functions associated with the operations of the semiconductor apparatus, including for example the input/output of data, in accordance with the operation mode information provided by the mode register set 200.

In one embodiment, the preliminary information providing block 303 may be configured to provide, to the mode register set 200, the preliminary information data PDMRS corresponding to a detected variation or change in one or more of operation parameters. In one embodiment, the preliminary information providing block 303 may be configured to provide to the mode register set 200 preliminary information data corresponding to a detected value of one or more operation parameters. One example of an operation parameter is an external temperature. The external temperature is detected in response to the preliminary information setting signal PDMRS_SET.

The preliminary information providing block 303 may be configured to detect an external temperature in response to the preliminary information setting signal PDMRS_SET and output a representation of the detected external temperature information as an update control signal N.

The preliminary information providing block 303 may be configured to provide the preliminary information data PDMRS corresponding to the value of the update control signal N generated in response to the preliminary information setting signal PDMRS_SET to the mode register set 200.

The preliminary information providing block 303 may include a detection unit including a temperature sensor 402 and a preliminary mode register set 500.

The temperature sensor 402 may be configured to detect a temperature in response to the preliminary information setting signal PDMRS_SET and output a representation of the detected temperature as the update control signal N. The temperature sensor 402 forwards the update control signal N to the preliminary mode register set 500.

The temperature sensor 402 may include a digital type temperature sensor. In an embodiment, the temperature sensor 402 may be configured to detect the temperature inside the semiconductor apparatus. In an embodiment, the temperature sensor 402 may be configured to detect the temperature outside of the semiconductor apparatus.

The preliminary mode register set 500 may be configured to provide the one of a plurality of pre-stored preliminary information data PDMRS which corresponds to the received update control signal N to the mode register set 200.

The preliminary mode register set 500 may be configured as shown in FIG. 4.

An embodiment of the operation mode setting circuit 103 of a semiconductor apparatus automatically detects a variation or change in a temperature and generates an update control signal N that is representative of the detected change or variation in response to the preliminary information setting signal PDMRS_SET. An embodiment of the operation mode setting circuit 103 of the semiconductor apparatus automatically detects the temperature and generates an update control signal N that is representative of the detected value of the temperature. In an embodiment, the preliminary information setting signal PDMRS_SET is internally generated by the semiconductor apparatus. In an embodiment, the preliminary information setting signal PDMRS_SET is received from the controller.

As mentioned above, the preliminary mode register set 500 forwards the preliminary information data PDMRS selected from the plurality of preliminary data PDMRS stored at the preliminary register set 500 to the mode register set 200. The forwarded preliminary information data PDMRS corresponds to the update control signal N. The operation mode setting circuit 103 updates the operation mode information at the mode register set 200 using the preliminary information data PDMRS.

The mode register set 200 provides the updated operation mode information to the function circuit blocks 30.

The function circuit blocks 30 perform their respective functions associated with operations of the semiconductor apparatus, including for example the input/output of data, in accordance with the operation mode information provided by the mode register set 200.

Figure 10:
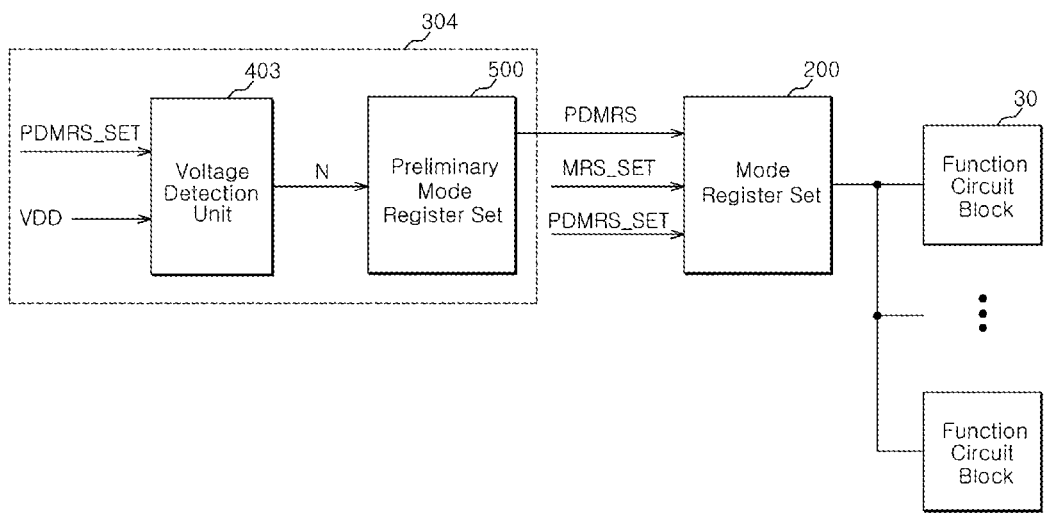
FIG. 10 is a block diagram showing an embodiment of an operation mode setting circuit of a semiconductor apparatus.

As shown in FIG. 10, an embodiment of an operation mode setting circuit 104 of a semiconductor apparatus may include a mode register set 200 and a preliminary information providing block 304.

The mode register set 200 may be configured to set an operation mode information in accordance with and in response to an operation mode setting command MRS_SET received at the semiconductor apparatus.

The mode register set 200 may be configured to update the operation mode information based on preliminary information data PDMRS generated internally by the semiconductor apparatus in response to a preliminary information setting signal PDMRS_SET.

The operation mode setting command MRS_SET may be a command for resetting the operation mode information of the mode register set 200. The mode setting command MRS_SET may be received from a device external to the semiconductor apparatus. One example of such an external device is a controller which controls the operation of the semiconductor apparatus.

The preliminary information setting signal PDMRS_SET may be a signal which is generated internally by the semiconductor apparatus in response to a signal associated with the initialization of the semiconductor apparatus. An example of a signal associated with the initialization of the semiconductor apparatus is a power-up signal (PWR).

The preliminary information setting signal PDMRS_SET may be provided to the semiconductor apparatus from the controller.

In the case where the controller provides the preliminary information setting signal PDMRS_SET to the semiconductor apparatus, the controller may provide the preliminary information setting signal PDMRS_SET in the form of a command to the semiconductor apparatus. The semiconductor apparatus may internally generate the preliminary information data PDMRS for setting the operation mode information and may perform an operation mode information update operation in response to the received preliminary information setting signal PDMRS_SET.

The mode register set 200 provides the operation mode information to function circuit blocks 30.

The function circuit blocks 30 perform their respective functions associated with the operations of the semiconductor apparatus, such as for example including the input/output of data, in accordance with the operation mode information provided by the mode register set 200.

In an embodiment, the preliminary information providing block 304 may be configured to provide, to the mode register set 200, the preliminary information data PDMRS corresponding to a detected variation or change in one or more operation parameters. In an embodiment, the preliminary information providing block 304 may be configured to provide to the mode register set 200 the preliminary information data PDMRS corresponding to a detected value of one or more operation parameters. One example of an operation parameter is an external voltage (a power supply voltage) supplied to the semiconductor apparatus. The external voltage is detected in response to the preliminary information setting signal PDMRS_SET.

In an embodiment, the preliminary information providing block 304 may be configured to detect a variation in the external voltage in response to the preliminary information setting signal PDMRS_SET and output a representative update control signal N. In an embodiment, the preliminary information providing block 304 may be configured to detect a value of the external voltage in response to the preliminary information setting signal PDMRS_SET and output a representative update control signal N.

The preliminary information providing block 304 may be configured to provide the preliminary information data PDMRS corresponding to the update control signal N generated in response to the preliminary information setting signal PDMRS_SET to the mode register set 200.

The preliminary information providing block 304 may include a voltage detection unit 403 and a preliminary mode register set 500.

In an embodiment, the voltage detection unit 403 may be configured to detect a variation in an external voltage, that is, a power supply voltage (VDD), in response to the preliminary information setting signal PDMRS_SET and output a representative update control signal N. In an embodiment, the voltage detection unit 403 may be configured to detect a value of an external voltage that is a power supply voltage (VDD), in response to the preliminary information setting signal PDMRS_SET and output a representative update control signal N.

The preliminary mode register set 500 may be configured to provide one of a plurality of pre-stored preliminary information data PDMRS which corresponds to the received update control signal N to the mode register set 200.

The preliminary mode register set 500 may be configured as shown in FIG. 4.

An embodiment of the operation mode setting circuit 104 of a semiconductor apparatus automatically detects a variation or change in the power supply voltage (VDD) and outputs the update control signal N that is representative of the detected change or variation in response to the preliminary information setting signal PDMRS_SET. An embodiment of the operation mode setting circuit 104 of a semiconductor apparatus automatically detects a value of the power supply voltage VDD and outputs an update control signal N that is representative of the detected value in response to the preliminary information setting signal PDMRS_SET. In an embodiment, the preliminary information setting signal PDMRS_SET is internally generated by the semiconductor apparatus. In an embodiment, the preliminary information setting signal PDMRS_SET is received from the controller.

As mentioned above, the preliminary mode register set 500 forwards the preliminary information data PDMRS selected from the plurality of preliminary data PDMRS stored at the preliminary register set 500 to the mode register set 200. The operation mode setting circuit 104 updates the operation mode information at the mode register set 200 using the preliminary information data PDMRS.

The mode register set 200 provides the updated operation mode information to the function circuit blocks 30.

The function circuit blocks 30 perform their respective functions associated with the operations of the semiconductor apparatus, including for example the input/output of data, in accordance with the operation mode information provided by the mode register set 200.

Figure 11:
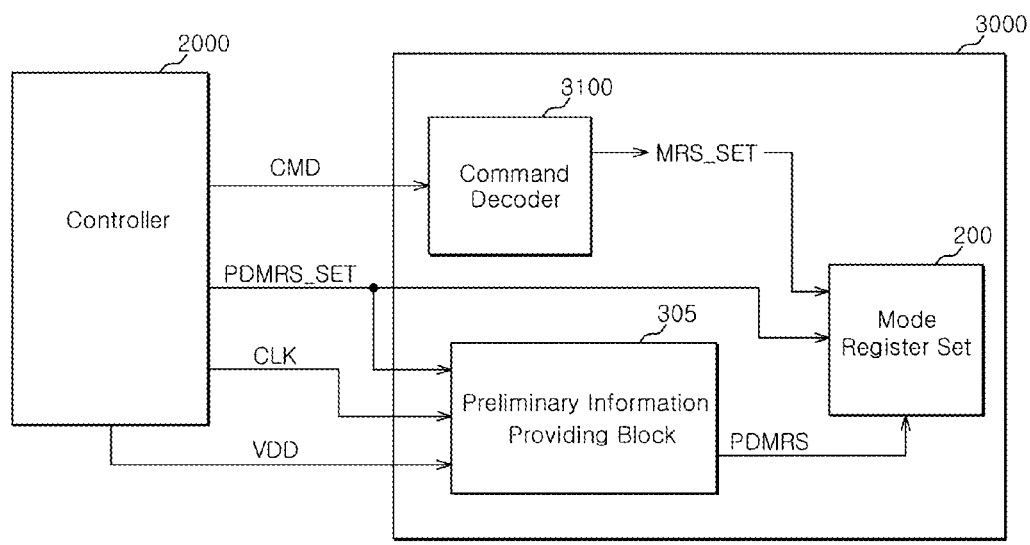
FIG. 11 is a block diagram showing an embodiment of a data processing system.

As shown in FIG. 11, an embodiment of a data processing system 1000 may include a controller 2000 and a semiconductor apparatus 3000. In an embodiment, the semiconductor apparatus 3000 is a memory device and the controller 2000 is a memory controller.

The controller 2000 may be configured to provide an external clock signal CLK, a power supply voltage VDD, a command CMD, and a preliminary information setting signal PDMRS_SET to the semiconductor apparatus 3000.

The semiconductor apparatus 3000 may include a command decoder 3100, a preliminary information providing block 305 and a mode register set 200.

An operation mode setting command MRS_SET may be encoded within the command CMD.

The preliminary information setting signal PDMRS_SET is a command issued from the controller 2000 to the semiconductor apparatus 3000 to perform an operation mode information update operation at the mode register set 200. The information for resetting the operation mode information is generated internally by the semiconductor apparatus 3000.

The preliminary information setting signal PDMRS_SET may be provided to the semiconductor apparatus 3000 via an address pin, a data input/output pin or a separate redundant pin.

It is possible to encode the preliminary information setting signal PDMRS_SET within the command CMD. The controller 2000 provides the command CMD encoded with the preliminary information setting signal PDMRS_SET to the semiconductor apparatus 3000.

The controller 2000 may provide the preliminary information setting signal PDMRS_SET to the semiconductor apparatus 3000 in those cases where a variation or change occurs in the operation c parameters of those elements provided to the semiconductor apparatus 3000 by the controller 2000. Examples of elements provided by the controller 2000 to the semiconductor apparatus 3000 include but are not limited to, the external clock signal CLK and the power supply voltage VDD. Examples of other operation parameters include but are not limited to an internal semiconductor apparatus temperature and an external semiconductor temperature.

The command decoder 3100 receives the command CMD as an input and may be configured to decode the command CMD to generate the operation mode setting command MRS_SET.

The preliminary information providing block 305 may include one or more different types of preliminary information providing blocks including the preliminary information providing block 300 of FIG. 2, the preliminary information providing block 301 of FIG. 5, the preliminary information providing block 302 of FIG. 7, the preliminary information providing block 303 of FIG. 9, and the preliminary information providing block 304 of FIG. 10.

The semiconductor apparatus 3000 may be configured to reset the operation mode information in response to an operation mode setting command MRS_SET received from.

An embodiment of the semiconductor apparatus 3000 may be configured to detect a variation in one or more operation parameters in response to the preliminary information setting signal PDMRS_SET. An embodiment of the semiconductor apparatus may be configured to detect a value of one or more operation parameters in response to the preliminary information setting signal PDMRS_SET. Examples of such operation parameters include but are not limited to, the external clock signal CLK, the power supply voltage VDD, and the temperature. The semiconductor apparatus 3000 may be configured to use the preliminary information providing block 305 to internally generate the preliminary information data PDMRS when it receives the preliminary information setting signal PDMRS_SET The semiconductor apparatus 3000 internally performs the operation mode information update operation at the mode register set 200 based on the preliminary information data PDMRS.

The descriptions of the operations performed by of semiconductor apparatus 3000 to detect a variation in an operation parameter s and update the operation mode information accordingly were given above with reference to FIGS. 2 to 10. The descriptions of the operations performed by of the semiconductor apparatus 3000 to detect a value of an operation parameter and update the operation mode information accordingly were given above with reference to FIGS. 2 to 10.

In an embodiment of the data processing system 1000, the controller 2000 detects a variation in an operation parameter associated with one or more elements provided by the controller 2002 to the semiconductor apparatus 3000 and provides the preliminary information setting signal PDMRS_SET to the semiconductor apparatus 3000.

In an embodiment, the semiconductor apparatus 3000 directly detects a variation in one or more operation parameters in response to the preliminary information setting signal PDMRS_SET and performs a operation mode information update at the mode register set 200. In an embodiment, the semiconductor apparatus 3000 directly detects a value of one or more operation parameters in response to the preliminary information setting signal PDMRS_SET and performs a operation mode information update at the mode register set In an embodiment the operation mode information may be automatically updated based on a detected variation in one or more operation parameters. In an embodiment, the operation mode information may be automatically updated based on a detected value of one or more operation parameters.

While certain embodiments have been described above, it will be understood to those skilled in the art that the embodiments described are by way of example only. Accordingly, the operation mode setting circuit of a semiconductor apparatus and the data processing system using the same described herein should not be limited based on the described embodiments. Rather, the operation mode setting circuit of a semiconductor apparatus and the data processing system using the same described herein should only be limited in light of the claims that follow when taken in conjunction with the above description and accompanying drawings.

What is claimed is:

1. An operation mode setting circuit of a semiconductor apparatus, comprising:
a mode register set configured to set an operation mode information in response to an operation mode setting command, and update a preliminary information data generated internally at the semiconductor apparatus as the operation mode information in response to a preliminary information setting signal; and
a preliminary information providing block configured to provide the preliminary information data selected from a plurality of pre-stored preliminary information data to the mode register set,
wherein the selected preliminary information data corresponds to a variation in an operation parameter detected in response to the preliminary information setting signal.

2. The operation mode setting circuit according to claim 1, wherein the preliminary information setting signal is generated internally at the semiconductor apparatus in response to a signal associated with initialization of the semiconductor apparatus.

3. The operation mode setting circuit according to claim 1, further comprising:
a plurality of function circuit blocks configured to perform operations of the semiconductor apparatus, in accordance with the operation mode information received from the mode register set.

4. The operation mode setting circuit according to claim 1, wherein the preliminary information providing block is configured to control values of the plurality of preliminary information data in response to a preliminary information control command.

5. The operation mode setting circuit according to claim 1, wherein the preliminary information providing block is configured to provide preliminary information data selected from the plurality of preliminary information data to the mode register set, the selected preliminary information data corresponding to a variation in a cycle time of a clock signal detected in response to the preliminary information setting signal.

6. The operation mode setting circuit according to claim 5, wherein the preliminary information providing block comprises:
a detection unit configured to generate an update control signal in response to the preliminary information setting signal and the clock signal; and
a preliminary mode register set configured to provide the one of the plurality of preliminary information data which corresponds to the update control signal to the mode register set.

7. The operation mode setting circuit according to claim 6, wherein the detection unit is configured to compare an internal clock signal generated in response to the preliminary information setting signal with I the clock signal and to generate the update control signal based on the comparison.

8. The operation mode setting circuit according to claim 6, wherein the detection unit comprises one of a delay-locked loop circuit and a phase-locked loop circuit.

9. The operation mode setting circuit according to claim 6, wherein the detection unit comprises:
a control section configured to generate an enable signal in response to the preliminary information setting signal and a count signal;
an internal clock generating section configured to generate an internal clock signal during an activation period of the enable signal; and
a comparison counter configured to compare a divided clock signal and the clock signal during the activation period of the enable signal and generate the update control signal based on the comparison.

10. The operation mode setting circuit according to claim 6, wherein the preliminary mode register set comprises:
a plurality of preliminary mode registers configured to store the plurality of preliminary information data; and
a multiplexing section configured to select a the one of the plurality of preliminary information data stored in the plurality of preliminary mode registers corresponding to a value of the update control signal.

11. The operation mode setting circuit according to claim 5, wherein the preliminary information providing block comprises:
a detection unit configured to generate an update control signal in response to the preliminary information setting signal and the clock signal;
a preliminary mode register set configured to provide the one of the plurality of preliminary information data, which corresponds to the update control signal to the mode register set; and
a programmable fuse array configured to control the values of the plurality of preliminary information data stored at the preliminary mode register set, in response to the preliminary information control command.

12. The operation mode setting circuit according to claim 1, wherein the preliminary information providing block is configured to provide preliminary information data selected from the plurality of preliminary information data corresponding to a variation in an external temperature external to the semiconductor apparatus detected in response to the preliminary information setting signal to the mode register set.

13. The operation mode setting circuit according to claim 12, wherein the preliminary information providing block comprises:
a temperature sensor configured to detect the external temperature in response to the preliminary information setting signal and output a representation of the detected temperature as an update control signal; and
a preliminary mode register set configured to provide the one of the plurality of preliminary information data which corresponds to the update control signal to the mode register set.

14. The operation mode setting circuit according to claim 12, wherein the preliminary information providing block comprises:
a temperature sensor configured to detect the external temperature in response to the preliminary information setting signal and output a representation of the detected temperature as an update control signal;
a preliminary mode register set configured to provide the one of the plurality of preliminary information data which corresponds to the update control signal to the mode register set; and a programmable fuse array configured to control the values of the plurality of preliminary information data in response to a preliminary information control command.

15. The operation mode setting circuit according to claim 1, wherein the preliminary information providing block is configured to provide preliminary information data selected from the plurality of preliminary information data, corresponding to a variation in an external voltage detected in response to the preliminary information setting signal to the mode register set.

16. The operation mode setting circuit according to claim 15, wherein the preliminary information providing block comprises:
   a voltage detection unit configured to detect the variation in the external voltage in response to the preliminary information setting signal and output a representation of the detected voltage variation as an update control signal; and
   a preliminary mode register set configured to provide the one of the plurality of preliminary information data which corresponds to the update control signal to the mode register set.

17. The operation mode setting circuit according to claim 15, wherein the preliminary information providing block comprises:
   a voltage detection unit configured to detect the variation in the external voltage in response to the preliminary information setting signal and output a representation of the detected voltage variation as an update control signal;
   a preliminary mode register set configured to provide the one of the plurality of preliminary information data corresponding to the update control signal to the mode register set; and
   a programmable fuse array configured to control the values of the plurality of the preliminary information data, in response to the preliminary information control command.

18. A data processing system comprising:
   a controller configured to provide a preliminary information setting signal; and
   a semiconductor apparatus configured to set an operation mode information of a mode register set in response to an operation mode setting command, and update a preliminary information data selected from a plurality of pre-stored preliminary information data as the operation mode information of the mode register set wherein the selected preliminary information data corresponds to a variation in an operation parameter detected in response to the preliminary information setting signal.

19. The data processing system according to claim 18, wherein the controller is configured to provide the operation mode setting command to the semiconductor apparatus to directly reset the operation mode information of the mode register set.

20. The data processing system according to claim 18, wherein the semiconductor apparatus is configured to provide preliminary information data selected from the plurality of preliminary information data to the mode register set in response to the preliminary information setting signal, the selected preliminary information data corresponding to an operation parameter detected in response to the preliminary information setting signal, wherein the operation parameter is selected from a group consisting of a cycle time of a clock signal, a variation in an external temperature and a variation in an external voltage.

21. The data processing system according to claim 20, wherein the semiconductor apparatus comprises:
   a detection unit configured to generate an update control signal in response to the preliminary information setting signal and the clock signal; and
   a preliminary mode register set configured to provide the one of the plurality of preliminary information data which corresponds to the update control signal to the mode register set.

22. The data processing system according to claim 20, wherein the semiconductor apparatus comprises:
   a temperature sensor configured to detect the external temperature n in response to the preliminary information setting signal and output a representation of the detected temperature as an update control signal; and
   a preliminary mode register set configured to provide the one of the plurality of preliminary information data which corresponds to the update control signal to the mode register set.

23. The data processing system according to claim 20, wherein the semiconductor apparatus comprises:
   a voltage detection unit configured to detect the variation in the external voltage in response to the preliminary information setting signal and output a representation of the detected voltage variation as an update control signal; and
   a preliminary mode register set configured to provide the one of the plurality of preliminary information data which corresponds to the update control signal to the mode register set.

24. An operation mode setting circuit of a semiconductor apparatus, comprising:
   a mode register set configured to set an operation mode information in response to an operation mode setting command, and update a preliminary information data generated internally at the semiconductor apparatus as the operation mode information in response to a preliminary information setting signal; and
   a preliminary information providing block configured to provide the preliminary information data selected from a plurality of pre-stored preliminary information data to the mode register set,
   wherein the selected preliminary information data corresponds to a value of an operation parameter detected in response to the preliminary information setting signal.

25. The operation mode setting circuit according to claim 24, wherein the selected preliminary information data corresponds to a detected value of a cycle time of a clock cycle.

26. The operation mode setting circuit according to claim 24, wherein the selected preliminary information data corresponds to a detected value of an external temperature outside of the semiconductor apparatus.

27. The operation mode setting circuit according to claim 24, wherein the selected preliminary information data corresponds to a detected value of a power supply voltage.

28. The operation mode setting circuit according to claim 24 wherein the semiconductor apparatus is a memory device and the preliminary information setting signal is received from a memory controller.

* * * * *